US007569924B2

(12) United States Patent
Fujii

(10) Patent No.: US 7,569,924 B2

(45) Date of Patent: Aug. 4, 2009

(54) SEMICONDUCTOR DEVICE AND MANUFACTURING METHOD THEREOF

(75) Inventor: Tomoharu Fujii, Nagano (JP)

(73) Assignee: Shinko Electric Industries Co., Ltd., Nagano-shi (JP)

( * ) Notice: Subject to any disclaimer, the term of this patent is extended or adjusted under 35 U.S.C. 154(b) by 197 days.

(21) Appl. No.: 11/459,543

(22) Filed: Jul. 24, 2006

(65) Prior Publication Data

US 2007/0023888 A1 Feb. 1, 2007

(30) Foreign Application Priority Data

Jul. 26, 2005 (JP) ............................ 2005-215871

(51) Int. Cl.
*H01L 23/12* (2006.01)
*H01L 23/05* (2006.01)

(52) U.S. Cl. .................. 257/700; 257/778; 257/E21.54

(58) Field of Classification Search ................. 257/296, 257/678, 700, 723, 737, 778, E21.579, E21.54, 257/E21.494; 438/637, 638
See application file for complete search history.

(56) References Cited

U.S. PATENT DOCUMENTS

| | | | | |
|---|---|---|---|---|
| 6,683,781 | B2 * | 1/2004 | Ho et al. | 361/301.1 |
| 7,208,832 | B2 * | 4/2007 | Yamagata | 257/701 |
| 2005/0082669 | A1 * | 4/2005 | Saijo et al. | 257/737 |
| 2005/0104218 | A1 * | 5/2005 | Tonami et al. | 257/773 |
| 2005/0224934 | A1 * | 10/2005 | Kato | 257/676 |
| 2006/0043568 | A1 * | 3/2006 | Abe et al. | 257/698 |

FOREIGN PATENT DOCUMENTS

| | | |
|---|---|---|
| JP | 2004-022667 | 1/2004 |

* cited by examiner

*Primary Examiner*—Michelle Estrada
(74) *Attorney, Agent, or Firm*—Rankin, Hill & Clark LLP

(57) ABSTRACT

A semiconductor chip 11 comprising an element formation layer which is formed on a first main surface 35A of a semiconductor substrate 35 and has a semiconductor element, through electrodes 15, 16 which are electrically connected to the semiconductor element and extend through the semiconductor chip 11, and a patch antenna 33 formed on the side of a second main surface 35B of the semiconductor substrate 35 are disposed, and the patch antenna 33 is electrically connected to the through electrode 15 electrically connected to a line for power feeding of the semiconductor element.

5 Claims, 16 Drawing Sheets

SEMICONDUCTOR DEVICE AND MANUFACTURING METHOD THEREOF

TECHNICAL FIELD

The present disclosure relates to a semiconductor device and a manufacturing method thereof, and particularly to a semiconductor device comprising a passive circuit and a manufacturing method thereof.

RELATED ART

There is means comprising an antenna as a passive circuit in a semiconductor device. Such a semiconductor device comprises a substrate, a semiconductor chip for CPU disposed on the substrate and an RF device, etc., and is used as, for example, a wireless module. Also, a chip antenna or an antenna pattern, etc. are used as the antenna.

FIG. 21 is a sectional view of a related-art semiconductor device comprising a chip antenna.

A semiconductor device 100 has a substrate 101, a semiconductor chip 102 for CPU, an RF device 103, a chip antenna 104 and a component 105 for matching as shown in FIG. 21. A wiring pattern (not shown) is formed in the substrate 101. The semiconductor chip 102 for CPU, the RF device 103, the chip antenna 104 and the component 105 for matching are disposed on the substrate 101. The component 105 for matching is electrically connected to the RF device 103 and the chip antenna 104 by the wiring pattern (not shown) disposed in the substrate 101.

FIG. 22 is a sectional view of a related-art semiconductor device comprising an antenna pattern. In FIG. 22, the same numerals are assigned to the same components as those of the semiconductor device 100 shown in FIG. 21.

A semiconductor device 110 has a substrate 101, a semiconductor chip 102 for CPU, an RF device 103 and an antenna pattern 111 as shown in FIG. 22. The semiconductor chip 102 for CPU and the RF device 103 are disposed on the substrate 101. The antenna pattern 111 is formed on the substrate 101, and is electrically connected to the semiconductor chip 102 for CPU and the RF device 103 by a wiring pattern (not shown) disposed in the substrate 101 (for example, see Patent Reference 1: Japanese Patent Unexamined Publication No. 2004-22667).

Also, there is a semiconductor device in which a CPU and an RF device are made in one semiconductor chip and are disposed on a substrate 101 by recent advance of CMOS technique.

However, in the semiconductor device 100, there was a problem that manufacturing cost of the semiconductor device 100 increases because the chip antenna 104 is expensive.

Also, in the case of using the chip antenna 104, it is necessary to dispose the component 105 for matching for adjusting an impedance, so that there were problems that an area of the substrate 101 increases and cost of the semiconductor device 100 increases and also the semiconductor device 100 cannot be miniaturized.

In the semiconductor device 110, in order to form the antenna pattern 111, a region larger than a formation region of the chip antenna 104 on the substrate 101 is required, so that there were problems that an area of the substrate 101 increases and cost of the semiconductor device 110 increases and also the semiconductor device 110 cannot be miniaturized.

Also, in the case of a semiconductor device comprising a semiconductor chip in which a CPU and an RF device are installed, formation regions of the semiconductor chip 102 for CPU and the RF device 103 can be decreased but the chip antenna 104 or the antenna pattern 111 is still required, so that there was a problem that it is difficult to miniaturize the semiconductor device sufficiently.

SUMMARY

Embodiments of the present invention provide a semiconductor device capable of achieving miniaturization and also reducing cost, and a manufacturing method of the semiconductor device.

According to a first aspect of one or more embodiments of the invention, a semiconductor device comprises a semiconductor chip comprising a semiconductor substrate and an element formation layer which is formed on a first main surface of the semiconductor substrate and has a semiconductor element, and a passive circuit electrically connected to the semiconductor element, wherein the passive circuit is disposed on the side of a second main surface opposite to the first main surface of the semiconductor substrate and the passive circuit is electrically connected to the semiconductor element by a through electrode extending through the semiconductor chip.

According to the first aspect of one or more embodiments of the invention, a passive circuit is disposed on the side of a second main surface opposite to a first main surface of a semiconductor substrate and the passive circuit is electrically connected to a semiconductor element by a through electrode extending through a semiconductor chip and thereby, a semiconductor device can be miniaturized as compared with a related-art semiconductor device in which a semiconductor chip and a passive circuit are disposed on the same plane of a substrate. Also, the need for a substrate for arranging the semiconductor chip and the passive circuit required in the related-art semiconductor device is eliminated, so that cost of the semiconductor device can be reduced.

According to a second aspect of one or more embodiments of the invention, a manufacturing method of a semiconductor device, which comprises a semiconductor chip having an element formation layer formed on a first main surface of a semiconductor substrate, a passive circuit disposed on the side of a second main surface opposite to the first main surface of the semiconductor substrate, and a through electrode which extends through the semiconductor chip and makes electrical connection between the passive circuit and a semiconductor element, the semiconductor substrate having plural semiconductor device formation regions in which the semiconductor device is formed, comprises a first step of forming the element formation layer in the plural semiconductor device formation regions of the semiconductor substrate, a second step of forming the through electrode, a third step of forming the passive circuit, and a fourth step of cutting the semiconductor substrate and dicing the semiconductor device after the first to third steps.

According to the second aspect of one or more embodiments of the invention, after an element formation layer is formed on a substrate body having plural semiconductor device formation regions, a through electrode and a passive circuit are subsequently formed on a semiconductor chip and a semiconductor device is finally diced and plural semiconductor device are manufactured at once and thereby, manufacturing cost of the semiconductor device can be reduced.

Various implementations may include one or more the following advantages. For example, a semiconductor device can be miniaturized and also cost of the semiconductor device can be reduced. Particularly, in a semiconductor chip in which a CPU and an RF device are mixed and installed, a manufacturing step of a wafer level can be applied, so that low cost can be achieved.

Other features and advantages may be apparent from the following detailed description, the accompanying drawings and the claims.

DETAILED DESCRIPTION

Next, embodiments of the invention will be described based on the drawings.

First Embodiment

Figure 1:
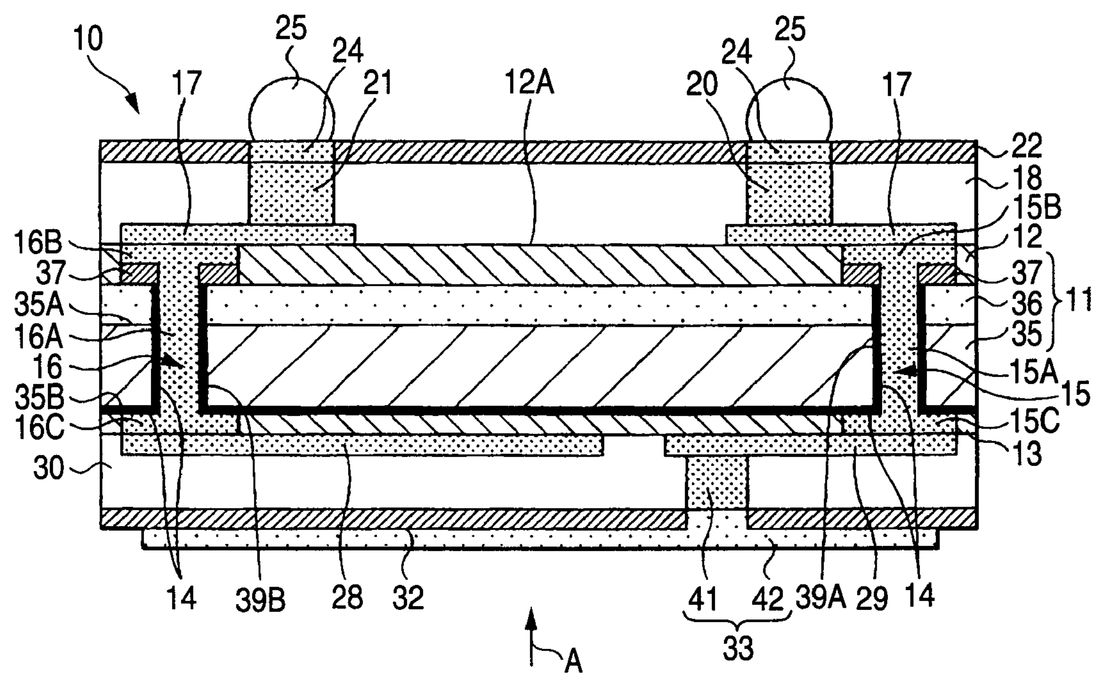
FIG. 1 is a sectional view of a semiconductor device according to a first embodiment of the invention.

FIG. 1 is a sectional view of a semiconductor device according to a first embodiment of the invention.

A semiconductor device 10 according to the first embodiment of the invention will be described with reference to FIG. 1. In addition, in the present embodiment, the case of using a patch antenna 33 as a passive circuit will be described below as an example.

The semiconductor device 10 has a semiconductor chip 11, protective films 12, 13, insulating films 14, 22, 32, through electrodes 15, 16, wirings 17, 29, insulating layers 18, 30, vias 20, 21, a diffusion preventive film 24, an external connection terminal 25, a ground layer 28, and the patch antenna 33 which is a passive circuit.

The semiconductor device 10 is means electrically connected to a mounting substrate (not shown) such as a motherboard through the external connection terminal 25.

The semiconductor chip 11 has a semiconductor substrate 35, an element formation layer 36 and an electrode pad 37. The semiconductor substrate 35 is formed in a plate shape and, for example, an Si substrate or a Ga—As substrate can be used.

The element formation layer 36 is formed on a first main surface 35A of the semiconductor substrate 35. The element formation layer 36 has a semiconductor element (not shown) such as a transistor, and a multilayer wiring structure (not shown) made of a laminated insulating layer, wiring and a via, etc. The semiconductor element is electrically connected to the wiring and the via of the multilayer wiring structure.

A plurality of the electrode pads 37 are disposed on the element formation layer 36. The electrode pad 37 is electrically connected to the semiconductor element (not shown). As material of the electrode pad 37, for example, Al can be used.

Also, plural through holes 39A, 39B extending through the semiconductor substrate 35, the element formation layer 36 and the electrode pad 37 are formed in the semiconductor chip 11.

The protective film 12 is disposed so as to cover the element formation layer 36 with the electrode pad 37 exposed. Also, an upper surface 12A of the protective film 12 is formed so as to protrude from the electrode pad 37. As the protective film 12, for example, an $SiO_2$ film or an SiN film formed by a sputtering method, a vapor deposition method, a CVD method, etc. can be used.

The protective film 13 is disposed so as to cover the insulating film 14 formed on a second main surface 35B (surface opposite to the first main surface 35A) of the semiconductor substrate 35 with connection parts 15C, 16C of the through electrodes 15, 16 exposed. As the protective film 13, for example, an $SiO_2$ film or an SiN film formed by a sputtering method, a vapor deposition method, a CVD method, etc. can be used.

The insulating film 14 is disposed so as to cover the second main surface 35B of the semiconductor substrate 35 and the element formation layer 36 and the semiconductor substrate 35 in which the through holes 39A, 39B are formed. The insulating film 14 is means for insulating the through electrodes 15, 16 from the semiconductor substrate 35 and the element formation layer 36. As the insulating film 14, for example, a thermally-oxidized film such as an $SiO_2$ film can be used.

The through electrode 15 (second through electrode) is electrically connected to a power feeding line of a semiconductor element (not shown), and has a through part 15A and connection parts 15B, 15C. The through part 15A is disposed in the through hole 39A formed in the semiconductor substrate 35. The connection part 15B is disposed in the end of the through part 15A located in the side of the first main surface 35A of the semiconductor substrate 35, and is electrically connected to the electrode pad 37. The connection part 15C is disposed in the end of the through part 15A located in the side of the second main surface 35B of the semiconductor substrate 35, and is electrically connected to the wiring 29. As material of the through electrode 15, a conductive metal can be used and concretely, Cu can be used.

The through electrode 16 (first through electrode) has a through part 16A and connection parts 16B, 16C. The through part 16A is disposed in the through hole 39B formed in the semiconductor substrate 35. The connection part 16B is disposed in the end of the through part 16A located in the side of the first main surface 35A of the semiconductor substrate 35, and is electrically connected to the electrode pad 37. The connection part 16C is disposed in the end of the through part 16A located in the side of the second main surface 35B of the semiconductor substrate 35, and is electrically connected to the ground layer 28. As a result of this, the through electrode 16 is set at a ground potential. As material of the through electrode 16, a conductive metal can be used and concretely, Cu can be used.

By disposing the through electrodes 15, 16 extending through the semiconductor chip 11 thus, a structure is also disposed on the side of the second main surface 35B of the semiconductor substrate 35 and electrical connection between the structure disposed on the side of the second main surface 35B and a structure disposed on the side of the first main surface 35A of the semiconductor substrate 35 can be made.

The wiring 17 is disposed on the protective film 12 and the connection part 15B. The wiring 17 is electrically connected to the through electrode 15 and the via 20. The wiring 17 is wiring for electrically connecting the through electrode 15 to the via 20 electrically connected to the external connection terminal 25.

By disposing such wiring 17, an arrangement position of the external connection terminal 25 can be adjusted so as to correspond to a distance between pads disposed in a mounting substrate in the case of connecting the semiconductor device 10 to the mounting substrate (not shown) such as a motherboard.

The insulating layer 18 (second insulating layer) is disposed so as to cover the protective film 12 and the wiring 17. As the insulating layer 18, for example, a sealing resin made of an epoxy resin or a polyimide resin formed by lamination of a resin film or a transfer molding method can be used.

The via 20 is disposed in the insulating layer 18 on the wiring 17 electrically connected to the through electrode 15. An upper surface of the via 20 is exposed from the insulating layer 18. The via 20 is electrically connected to the diffusion preventive film 24 and the wiring 17 electrically connected to the through electrode 15. The via 21 is disposed in the insulating layer 18 on the wiring 17 electrically connected to the through electrode 16. The via 21 is exposed from the insulating layer 18, and is electrically connected to the diffusion preventive film 24 and the wiring 17 electrically connected to the through electrode 16. As material of the vias 20, 21, a conductive metal can be used and, for example, Cu can be used.

The insulating film 22 is disposed so as to cover the insulating layer 18 with the diffusion preventive film 24 exposed. As the insulating film 22, for example, a solder resist of an epoxy resin or a polyimide resin can be used. In addition, there is no need to dispose the insulating film 22.

The diffusion preventive film 24 is disposed on the upper surfaces of the vias 20, 21 exposed from the insulating layer 18. The diffusion preventive film 24 is a film for preventing Cu included in the vias 20, 21 from diffusing to the external connection terminal 25. As the diffusion preventive film 24, for example, an Ni/Au laminated film in which an Ni layer and an Au layer are sequentially laminated can be used.

The external connection terminal 25 is disposed on the diffusion preventive film 24. The external connection terminal 25 is electrically connected to any one of the through electrodes 15, 16. The external connection terminal 25 is a terminal for making electrical connection to the mounting substrate such as a motherboard. As the external connection terminal 25, for example, a solder ball can be used.

The ground layer 28 is disposed on the protective film 13 and the connection part 16C. The ground layer 28 is set at a ground potential and is electrically connected to the through electrode 16. As material of the ground layer 28, a conductive metal can be used and, for example, Cu can be used.

The wiring 29 is disposed on the protective film 13 and the connection part 15C. The wiring 29 is electrically connected to the through electrode 15 and the patch antenna 33. As a result of this, the patch antenna 33 is electrically connected to a power feeding line of the semiconductor element. As material of the wiring 29, a conductive metal can be used and, for example, Cu can be used.

The insulating layer 30 (first insulating layer) is disposed so as to cover the protective film 13, the wiring 29 and the ground layer 28. As the insulating layer 30, for example, a sealing resin made of an epoxy resin or a polyimide resin formed by lamination of a resin film or a transfer molding method can be used.

The insulating film 32 is disposed so as to cover the insulating layer 30 with a via part 41 of the patch antenna 33 exposed. As the insulating film 32, for example, an epoxy resin or a polyimide resin can be used. For example, when a sealing resin formed by a transfer molding method is used as the insulating layer 30, the sealing resin has bad adhesion to a plating film. As a result of that, in the embodiment, the insulating film 32 is disposed on the insulating layer 30 as an adhesion layer.

The patch antenna 33 is disposed on the side of the second main surface 35B of the semiconductor substrate 35, and has the via part 41 and an antenna part 42. The via part 41 is disposed in the insulating layer 30. Also, one end of the via part 41 is connected to the wiring 29, and the other end is connected to the antenna part 42 and is exposed from the insulating layer 30. The via part 41 is electrically connected to the through electrode 15 through the wiring 29.

Figure 2:
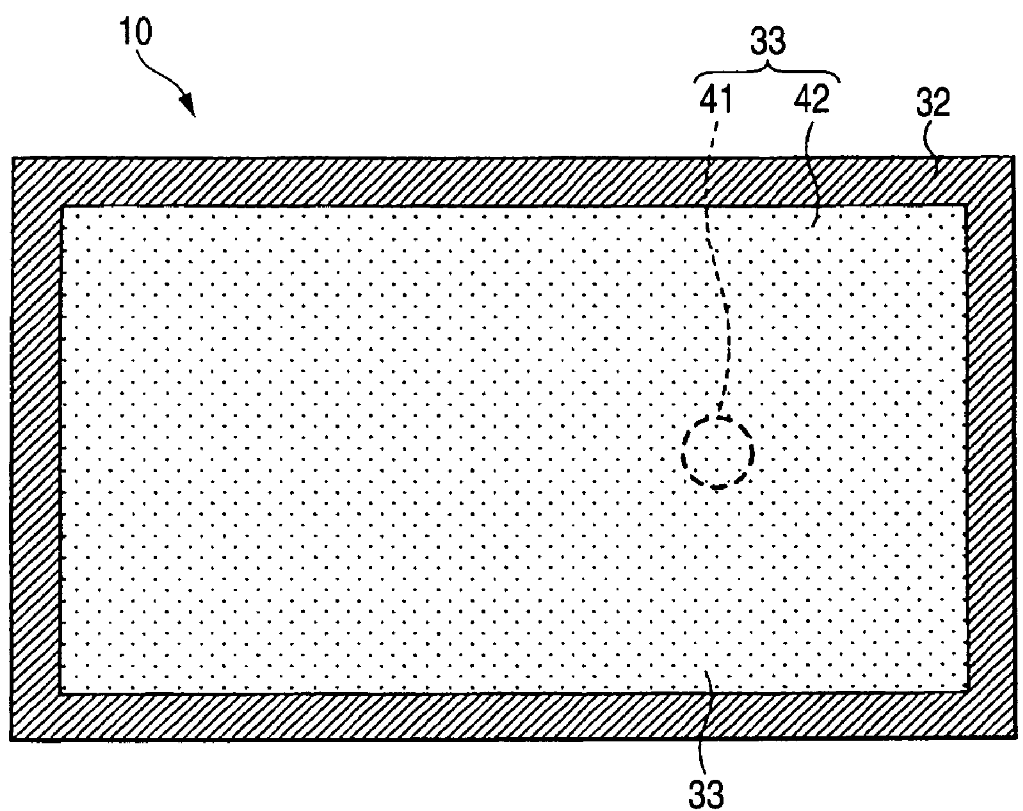
FIG. 2 is a diagram in which the semiconductor device shown in FIG. 1 is viewed from A.

FIG. 2 is a diagram in which the semiconductor device shown in FIG. 1 is viewed from A.

As shown in FIGS. 1 and 2, the antenna part 42 is formed in a plate shape and is disposed on the insulating film 32 and the via part 41. The antenna part 42 is electrically connected to the via part 41. As material of the patch antenna 33, a conductive metal can be used and, for example, Cu can be used.

By disposing the patch antenna 33 which is a passive circuit on the side of the second main surface 35B opposite to the side of the first main surface 35A of the semiconductor substrate 35 in which the element formation layer 36 or the external connection terminal 25 is formed thus, a size (planar size) in a direction of area of the semiconductor chip 11 can be miniaturized.

According to the semiconductor device of the embodiment, the through electrodes 15, 16 which are electrically connected to the semiconductor element (not shown) and extend through the semiconductor chip 11 are disposed and also the patch antenna 33 is disposed on the side of the second main surface 35B opposite to the first main surface 35A of the semiconductor substrate 35 and the patch antenna 33 is electrically connected to the through electrode 15 and thereby, the semiconductor device 10 can be miniaturized as compared with related-art semiconductor device 100, 110 in which a semiconductor chip and a passive circuit are arranged on the same plane of a substrate. Also, the need for a substrate for arranging the semiconductor chip and the passive circuit required in the related-art semiconductor device 100, 110 is eliminated, so that cost of the semiconductor device 10 can be reduced.

In addition, an insulating film (for example, a solder resist) for covering and protecting the patch antenna 33 may be disposed on a surface of the patch antenna 33. Also, the embodiment can be applied to a semiconductor device without comprising the external connection terminal 25.

Figure 3:
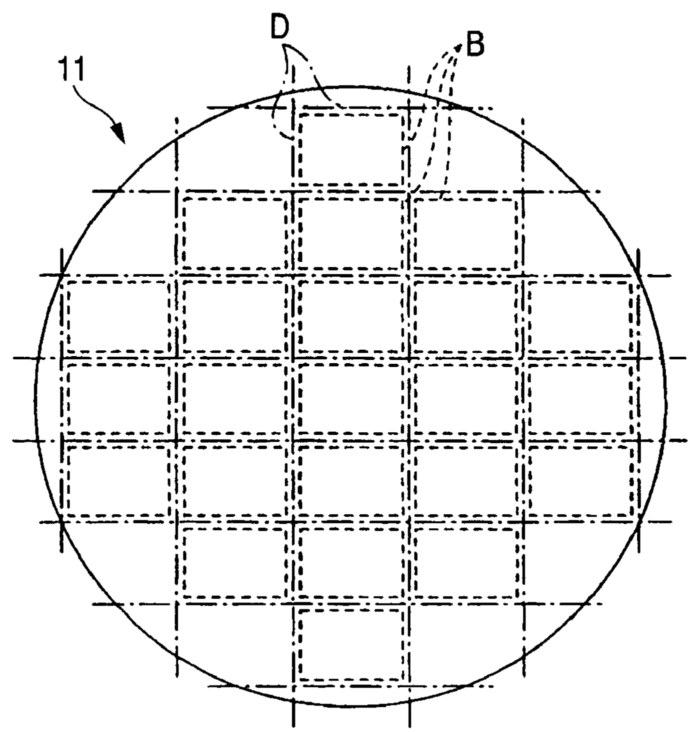
FIG. 3 is a diagram showing one example of a semiconductor substrate.

FIG. 3 is a diagram showing one example of a semiconductor substrate. In FIG. 3, D shows a cutting position (hereinafter called "a cutting position D") in the case of cutting a semiconductor substrate by a dicing blade.

The semiconductor device 10 is manufactured in a substrate body 35 having, for example, plural semiconductor device formation regions B for forming the semiconductor device 10 as shown in FIG. 3.

FIGS. 4 to 17 are diagrams showing manufacturing steps of the semiconductor device according to the first embodiment. In FIGS. 4 to 17, the same numerals are assigned to the same components as those of the semiconductor device 10 described in FIGS. 1 and 2.

A manufacturing method of the semiconductor device according to the first embodiment will be described with reference to FIGS. 4 to 17. In addition, here, the case of manufacturing the semiconductor device 10 in a semiconductor substrate 35 (see FIG. 3) having the semiconductor device formation regions B will be described below as an example.

Figure 4:
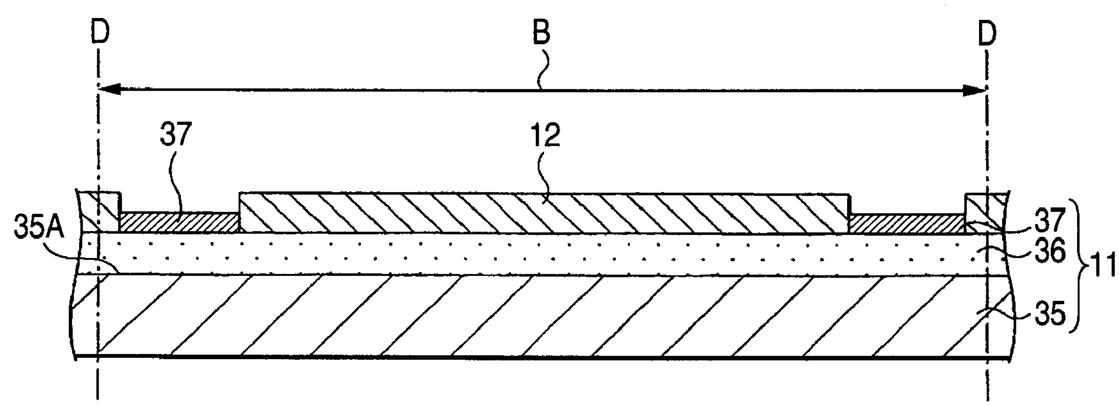
FIG. 4 is a diagram showing a manufacturing step of the semiconductor device according to the first embodiment (first).

First, as shown in FIG. 4, an element formation layer 36 is formed in plural semiconductor device formation regions B on a first main surface 35A of the semiconductor substrate 35 (first step) and next, an electrode pad 37 and a protective film 12 for exposing the electrode pad 37 are sequentially formed on the element formation layer 36.

The electrode pad 37 is formed by patterning Al formed by, for example, a sputtering method by a dry etching method. Also, the protective film 12 can be formed by, for example, a sputtering method, a vapor deposition method or a CVD method. As the protective film 12, for example, an $SiO_2$ film or an SiN film can be used.

Figure 5:
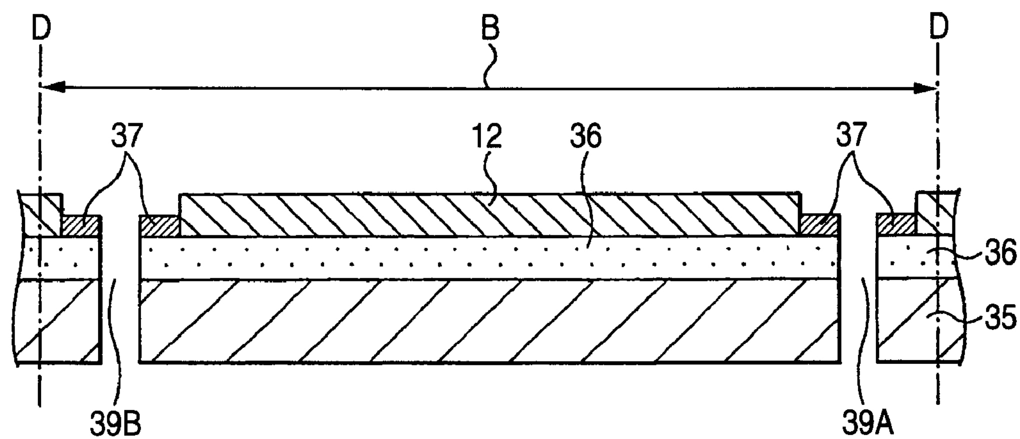
FIG. 5 is a diagram showing a manufacturing step of the semiconductor device according to the first embodiment (second).

Then, as shown in FIG. 5, through holes 39A, 39B extending through the electrode pad 37, the element formation layer 36 and the semiconductor substrate 35 are formed. The through holes 39A, 39B are formed by, for example, a laser or dry etching.

Figure 6:
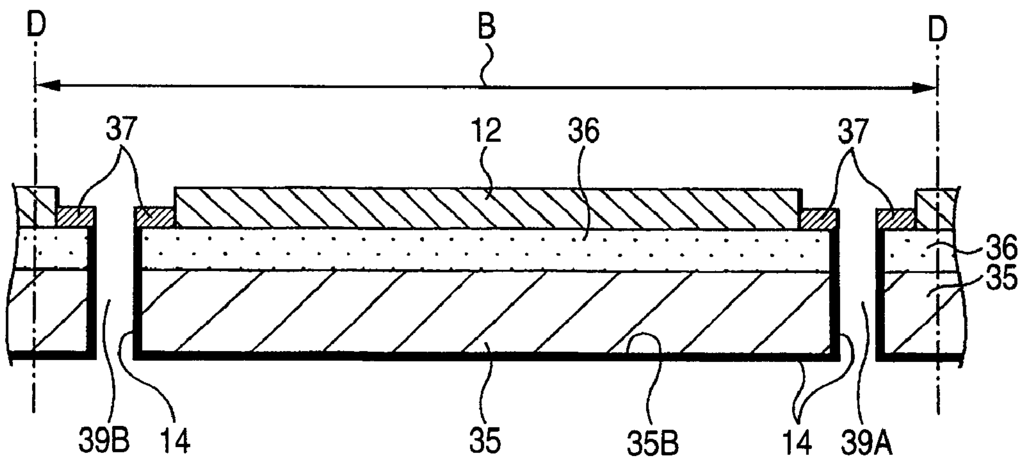
FIG. 6 is a diagram showing a manufacturing step of the semiconductor device according to the first embodiment (third).

Then, as shown in FIG. 6, an insulating film 14 is formed on a second main surface 35B of the semiconductor substrate 35 and the element formation layer 36 and the semiconductor substrate 35 in which the through holes 39A, 39B are formed. As the insulating film 14, for example, a thermally-oxidized film (an $SiO_2$ film) formed by heating treatment or an $SiO_2$ film or an SiN film formed by a CVD method can be used.

Figure 7:
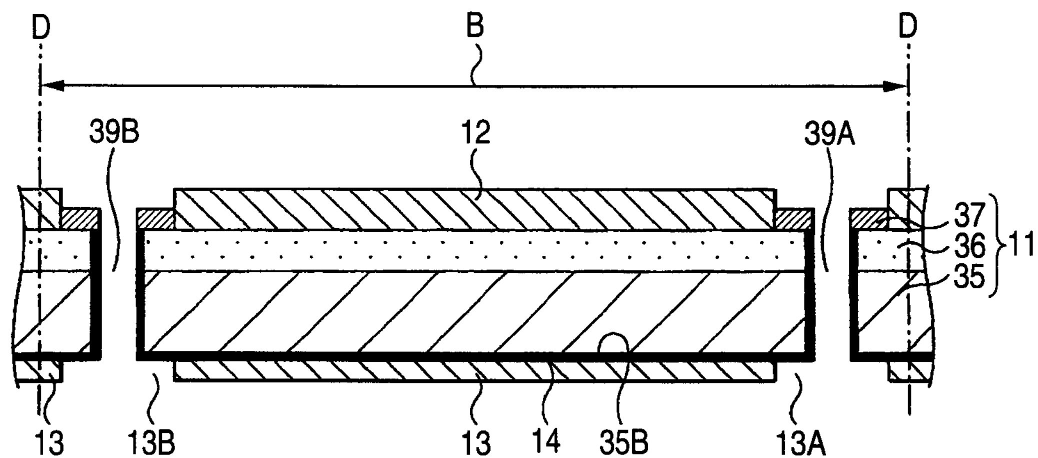
FIG. 7 is a diagram showing a manufacturing step of the semiconductor device according to the first embodiment (fourth).

Then, as shown in FIG. 7, a protective film 13 having openings 13A, 13B is formed on the insulating film 14 of the second main surface 35B. The insulating film 14 is exposed to the openings 13A, 13B. Also, the opening 13A corresponds to a shape of a connection part 15C, and the opening 13B corresponds to a shape of a connection part 16C. The protective film 13 can be formed by, for example, a sputtering method, a vapor deposition method or a CVD method. Also, as the protective film 13, for example, an $SiO_2$ film or an SiN film can be used.

Figure 8:
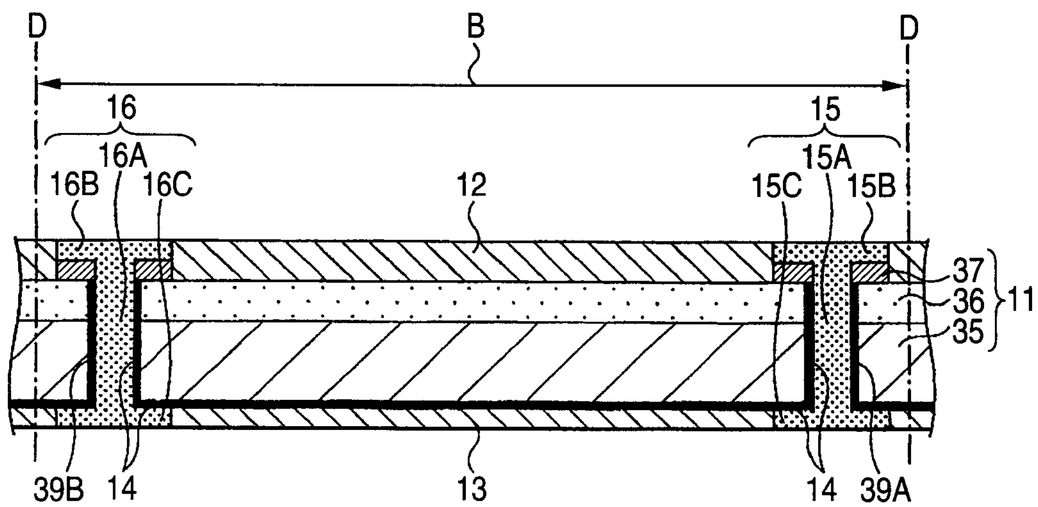
FIG. 8 is a diagram showing a manufacturing step of the semiconductor device according to the first embodiment (fifth).

Then, as shown in FIG. 8, a through electrode 15 is formed in the through hole 39A and a through electrode 16 is formed in the through hole 39B at the same time (second step). The through electrodes 15, 16 can be formed by, for example, a plating method or a CVD method. In the case of using an electrolytic plating method, a seed layer made of Ti or Cu, etc. is formed on an inner wall of the through holes 39A, 39B by a CVD method and thereafter, a conductive metal is precipitated using the seed layer as a power feeding layer. Also, as material of the through electrodes 15, 16, a conductive metal can be used and, for example, Cu can be used.

Figure 9:
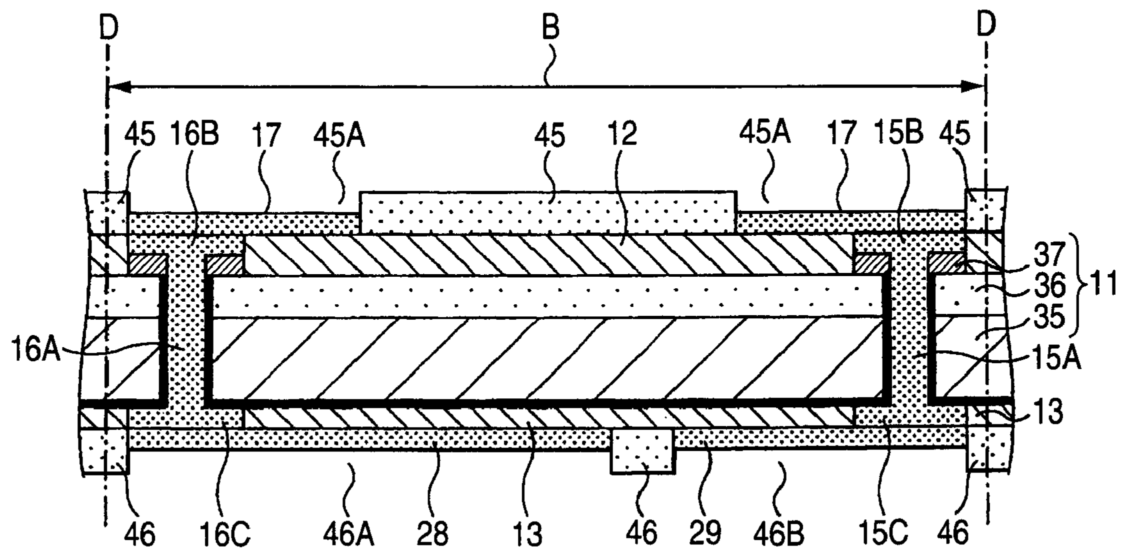
FIG. 9 is a diagram showing a manufacturing step of the semiconductor device according to the first embodiment (sixth).

Then, as shown in FIG. 9, a resist layer 45 having an opening 45A is formed on an upper surface of the structure shown in FIG. 8 and a resist layer 46 having openings 46A, 46B is formed on a lower surface of the structure shown in FIG. 8. The opening 45A corresponds to a shape of wiring 17. Also, the opening 46A corresponds to a shape of a ground layer 28 and the opening 46B corresponds to a shape of wiring 29. Thereafter, conductive metals are disposed in the openings 45A, 46A, 46B, and the wirings 17, 29 and the ground layer 28 are simultaneously formed. The resist layers 45, 46 are removed by a resist release liquid after the wirings 17, 29 and the ground layer 28 are formed. Also, as the conductive metal, for example, Cu can be used. Also, the conductive metal can be formed by, for example, a plating method. In the case of using an electrolytic plating method, a seed layer made of Cr or Cu, etc. is formed on both surfaces of the structure shown in FIG. 8 by an electroless plating method or a sputtering method and thereafter, the resist layers 45, 46 are formed and then, the conductive metal is precipitated using the seed layer as a power feeding layer. There after, the resist layers 45, 46 are removed.

Figure 10:
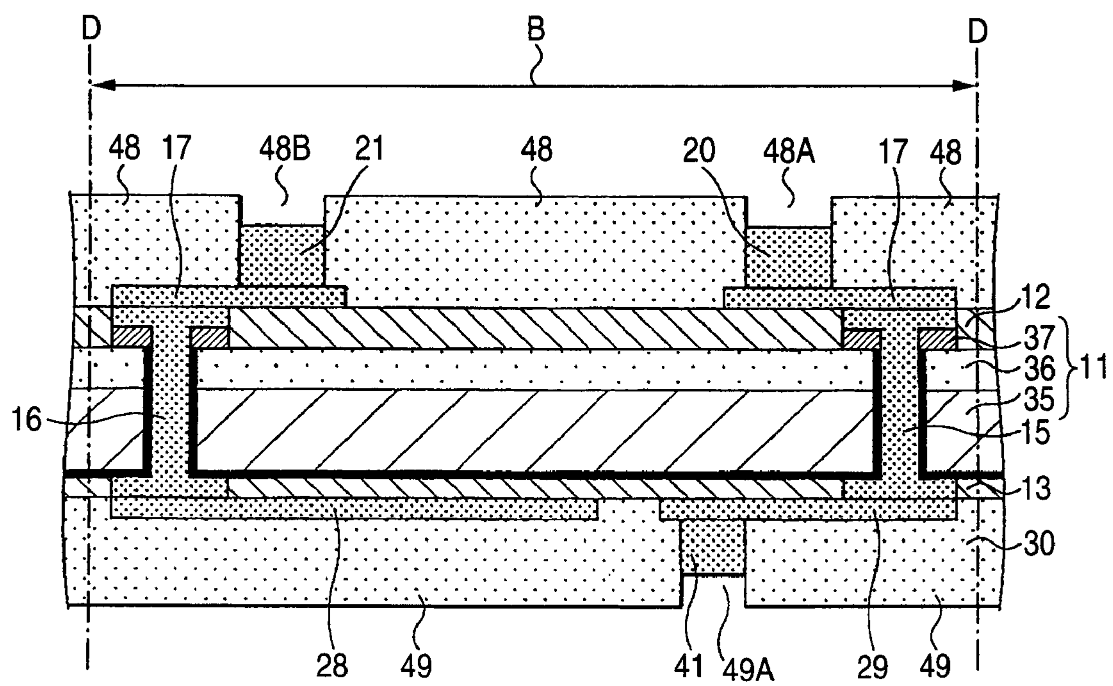
FIG. 10 is a diagram showing a manufacturing step of the semiconductor device according to the first embodiment (seventh).

Then, as shown in FIG. 10, a resist layer 48 having openings 48A, 48B is formed on an upper surface of a structure in which the wirings 17, 29 and the ground layer 28 are formed and the resist layers 45, 46 are removed, and a resist layer 49 having an opening 49A is formed on a lower surface of the structure. The wiring 17 is exposed to the openings 48A, 48B and the wiring 29 is exposed to the opening 49A. Also, the opening 48A corresponds to a shape of a via 20, and the opening 48B corresponds to a shape of a via 21, and opening 49A corresponds to a shape of a via part 41. After the resist layers 48, 49 are formed, conductive metals are precipitated on the wiring 17 and the wiring 29, and the vias 20, 21 and the via part 41 are formed. As material of the vias 20, 21 and the via part 41, for example, Cu can be used. Also, the resist layers 48, 49 are removed by a resist release liquid after the vias 20, 21 and the via part 41 are formed. Thereafter, an unnecessary seed layer in which the wirings 17, 29 and the ground layer 28 are not formed is removed by etching.

Figure 11:
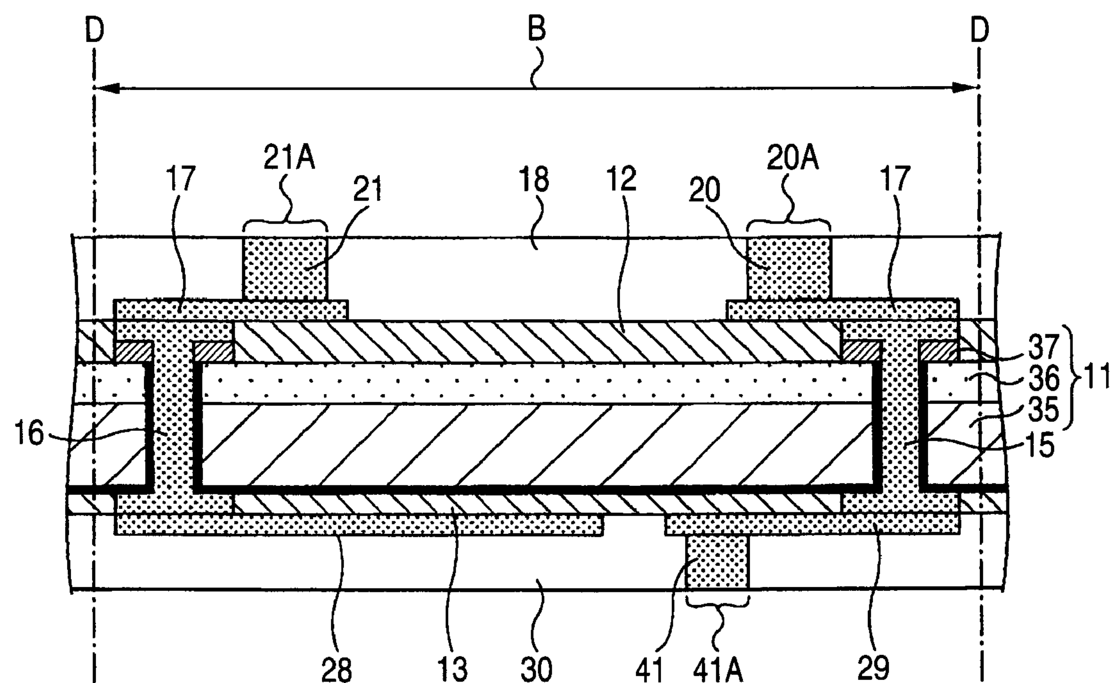
FIG. 11 is a diagram showing a manufacturing step of the semiconductor device according to the first embodiment (eighth).

Then, as shown in FIG. 11, an insulating layer 18 which becomes substantially flush with surfaces 20A, 21A of the vias 20, 21 is formed on an upper surface of a structure in which the wirings 17, 29 and the ground layer 28 are formed, and an insulating layer 30 which becomes substantially flush with a surface 41A of the via part 41 is formed on a lower surface of the structure. As the insulating layers 18, 30, a sealing resin can be used. Also, the sealing resin can be formed by, for example, lamination of a resin film or a transfer molding method using an epoxy resin or a polyimide resin, etc. as material.

Figure 12:
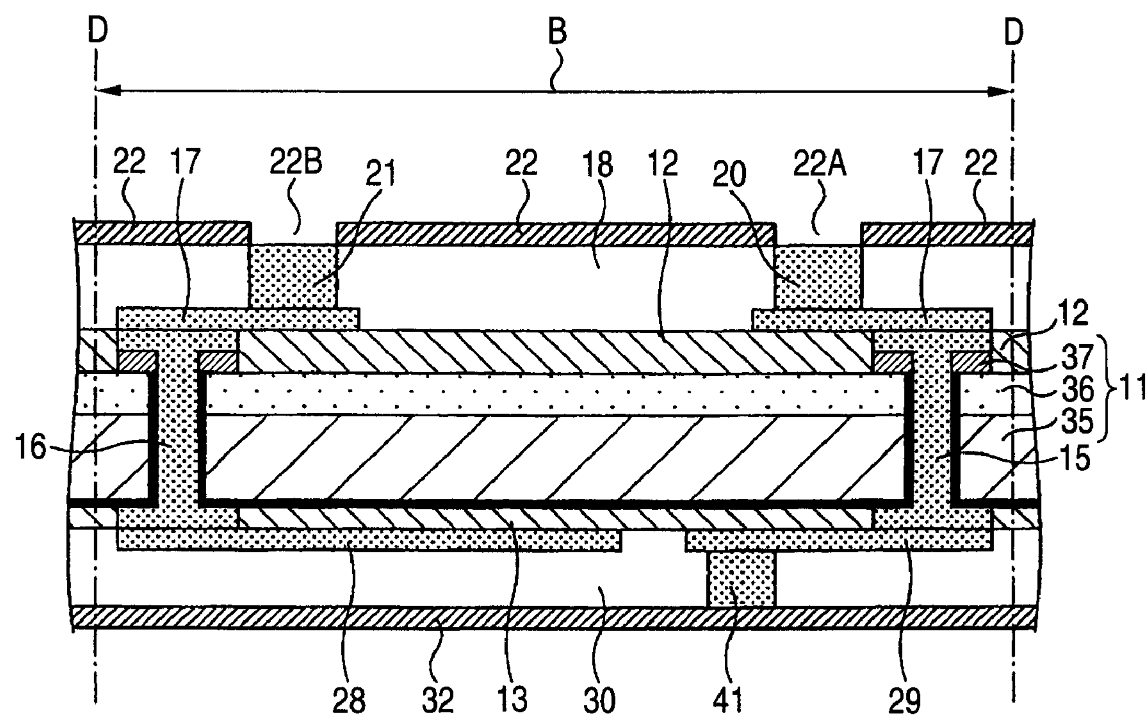
FIG. 12 is a diagram showing a manufacturing step of the semiconductor device according to the first embodiment (ninth).

Then, as shown in FIG. 12, an insulating film 22 having openings 22A, 22B is formed on an upper surface of the structure shown in FIG. 11, and an insulating film 32 for covering a lower surface of the structure is formed. The via 20 is exposed to the opening 22A and the via 21 is exposed to the opening 22B. The insulating films 22, 32 are formed by applying, for example, an epoxy resin or a polyimide resin. In addition, a resin functioning as a solder resist is used in the insulating film 22.

Figure 13:
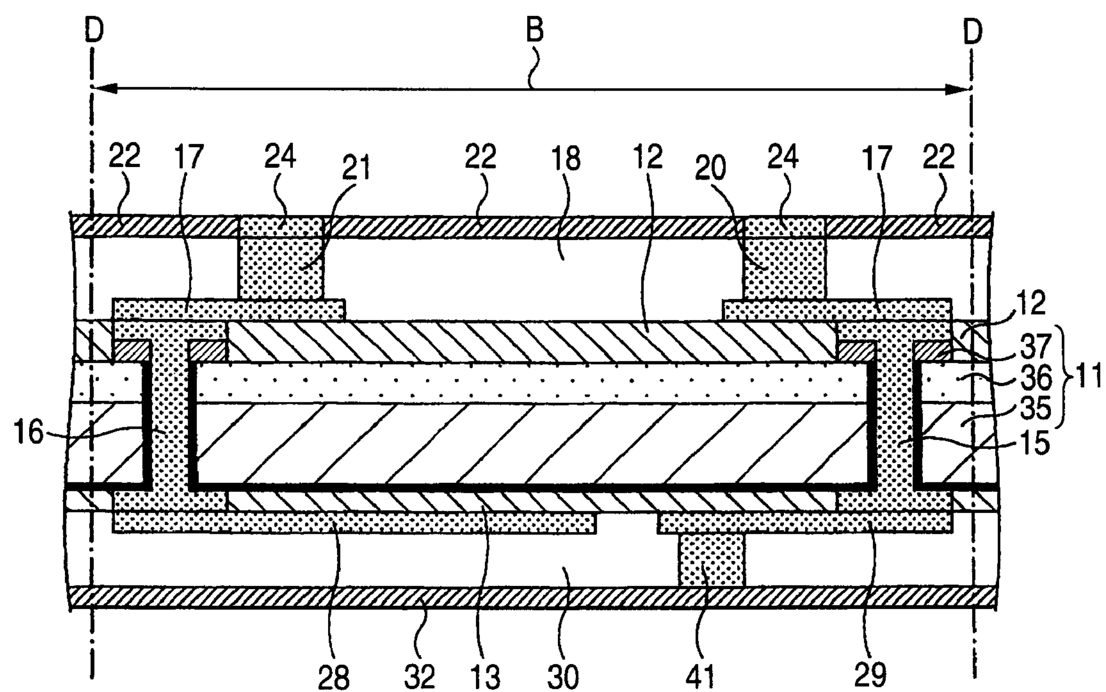
FIG. 13 is a diagram showing a manufacturing step of the semiconductor device according to the first embodiment (tenth).

Then, as shown in FIG. 13, a diffusion preventive film 24 is formed on the vias 20, 21 exposed to the openings 22A, 22B. The diffusion preventive film 24 is formed by, for example, sequentially laminating an Ni layer and an Au layer by an electroless plating method.

Figure 14:
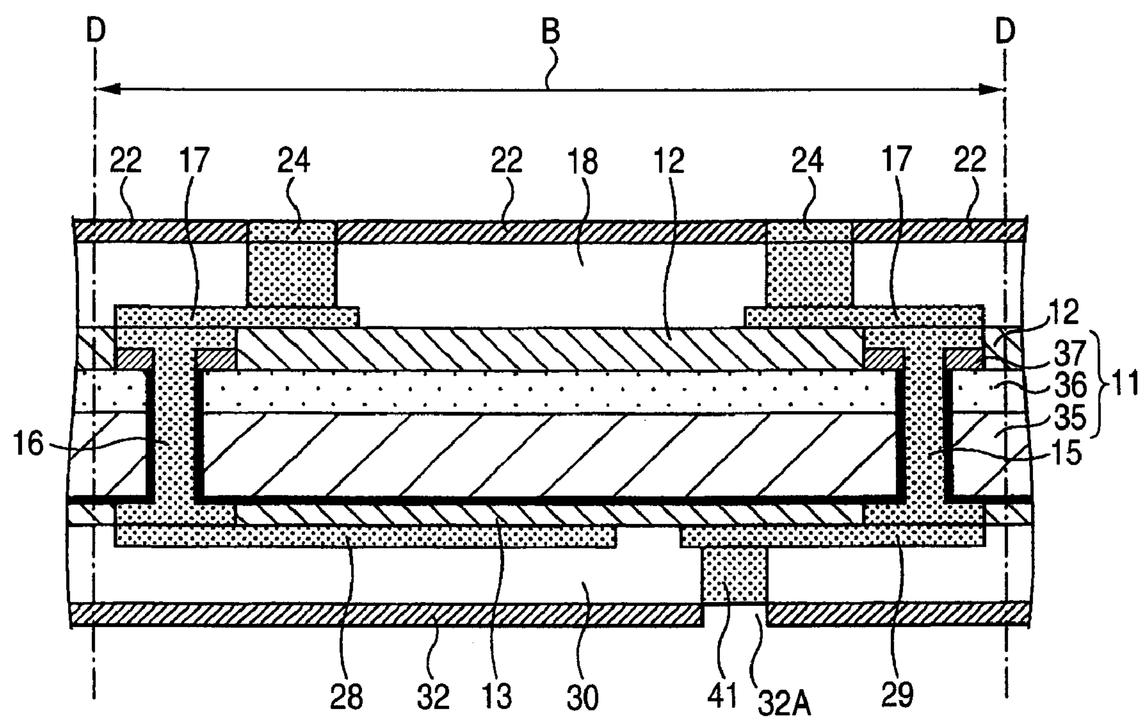
FIG. 14 is a diagram showing a manufacturing step of the semiconductor device according to the first embodiment (eleventh).

Then, as shown in FIG. 14, an opening 32A to which the via part 41 is exposed is formed in the insulating film 32. The opening 32A is formed by, for example, a laser.

Figure 15:
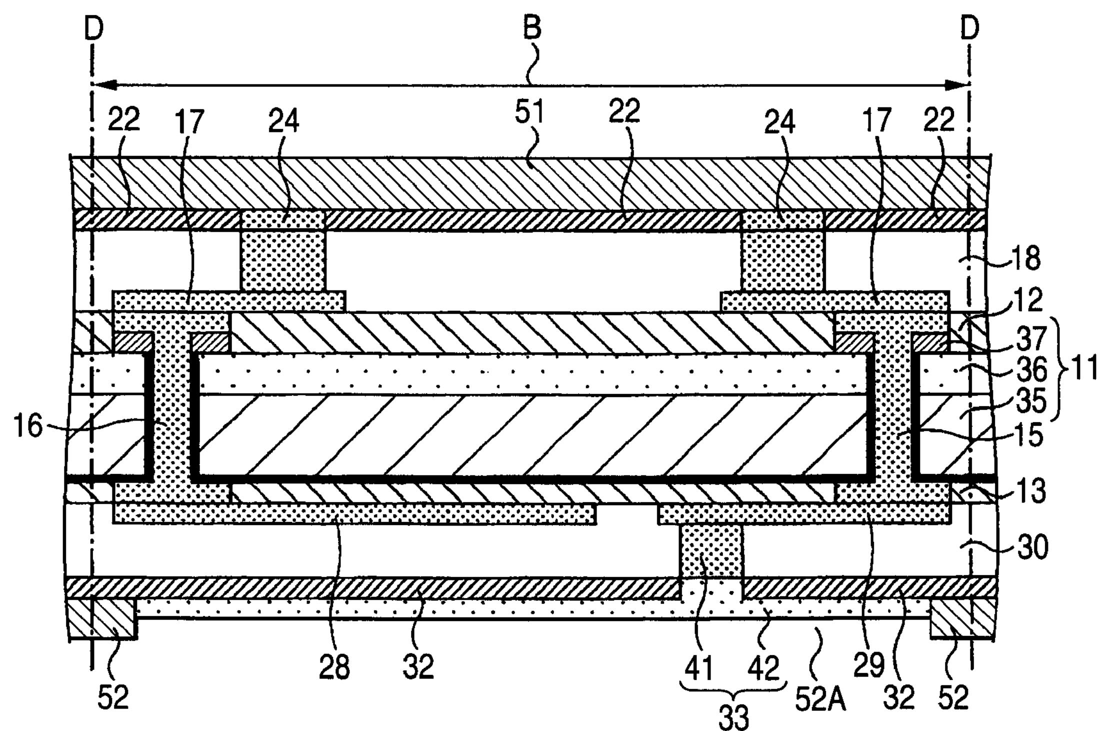
FIG. 15 is a diagram showing a manufacturing step of the semiconductor device according to the first embodiment (twelfth).

Then, as shown in FIG. 15, a resist layer 51 for covering an upper surface of the structure shown in FIG. 14 is formed and a resist layer 52 having an opening 52A is formed on a lower surface of the structure. The opening 52A corresponds to a shape of an antenna part 42, and the via part 41 and a part of the insulating film 32 are exposed to the opening 52A. After the resist layers 51, 52 are formed, a conductive metal is disposed in the opening 52A and the antenna part 42 is formed. As a result of this, a patch antenna 33 made of the via part 41 and the antenna part 42 is formed. As a conductive metal resulting in the antenna part 42, for example, Cu formed by an electrolytic plating method can be used. Concretely, a seed layer made of Cr or Cu, etc. is formed on a lower surface of the structure shown in FIG. 14 by an electroless plating method or a sputtering method and thereafter, the resist layer 52 is formed and then, the conductive metal is precipitated using the seed layer as a power feeding layer and the antenna part is formed. Also, the resist layers 51, 52 are removed by a resist release liquid after the antenna part 42 is formed. Thereafter, the seed layer which is not covered with the antenna part 42 is removed.

Figure 16:
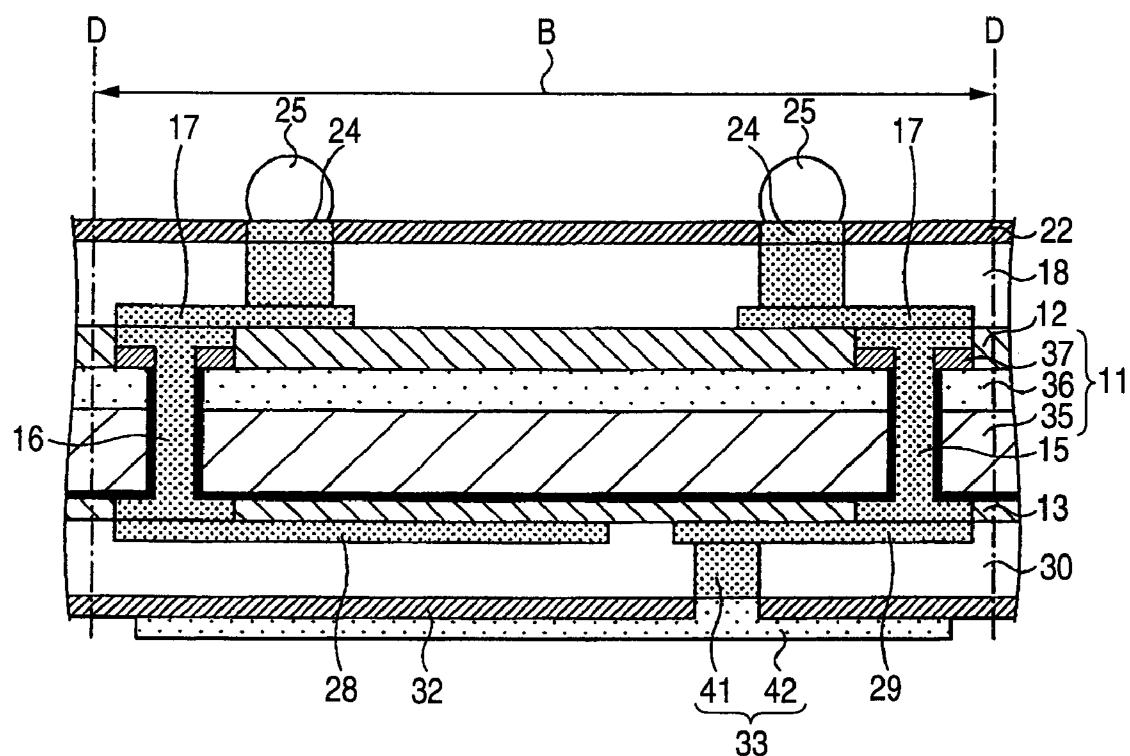
FIG. 16 is a diagram showing a manufacturing step of the semiconductor device according to the first embodiment (thirteenth).

Then, as shown in FIG. 16, an external connection terminal 25 is formed on the diffusion preventive film 24. As the external connection terminal 25, for example, a solder ball can be used.

Figure 17:
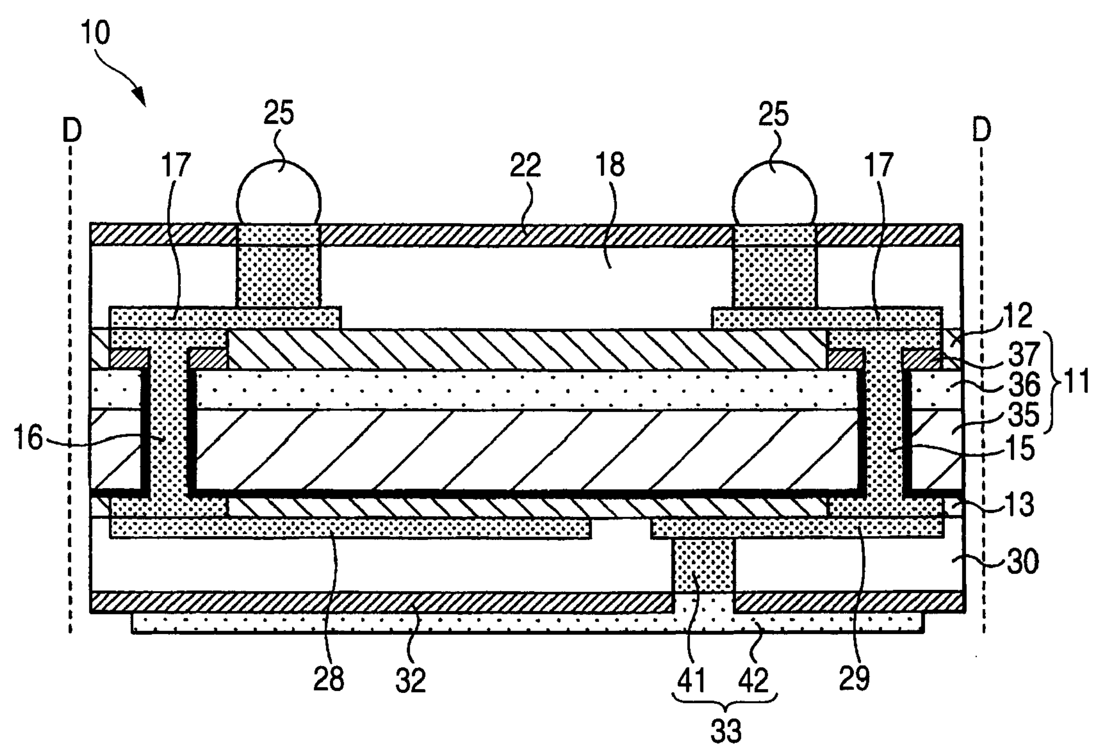
FIG. 17 is a diagram showing a manufacturing step of the semiconductor device according to the first embodiment (fourteenth).

Thereafter, as shown in FIG. 17, a semiconductor device 10 is diced by cutting the cutting positions D of the semiconductor substrate 35 by a dicing blade. As a result of this, plural semiconductor device 10 are manufactured at once.

According to the manufacturing method of the semiconductor device of the embodiment, after the element formation layer 36 is formed on the semiconductor substrate 35 (semiconductor wafer) having plural semiconductor device formation regions B, the through electrodes 15, 16, the patch antenna 33, the external connection terminal 25, etc. are formed on the semiconductor chip 11 and the semiconductor substrate 35 is finally cut and plural semiconductor device 10 are manufactured at once, so that manufacturing cost of the semiconductor device 10 can be reduced.

Second Embodiment

Figure 18:
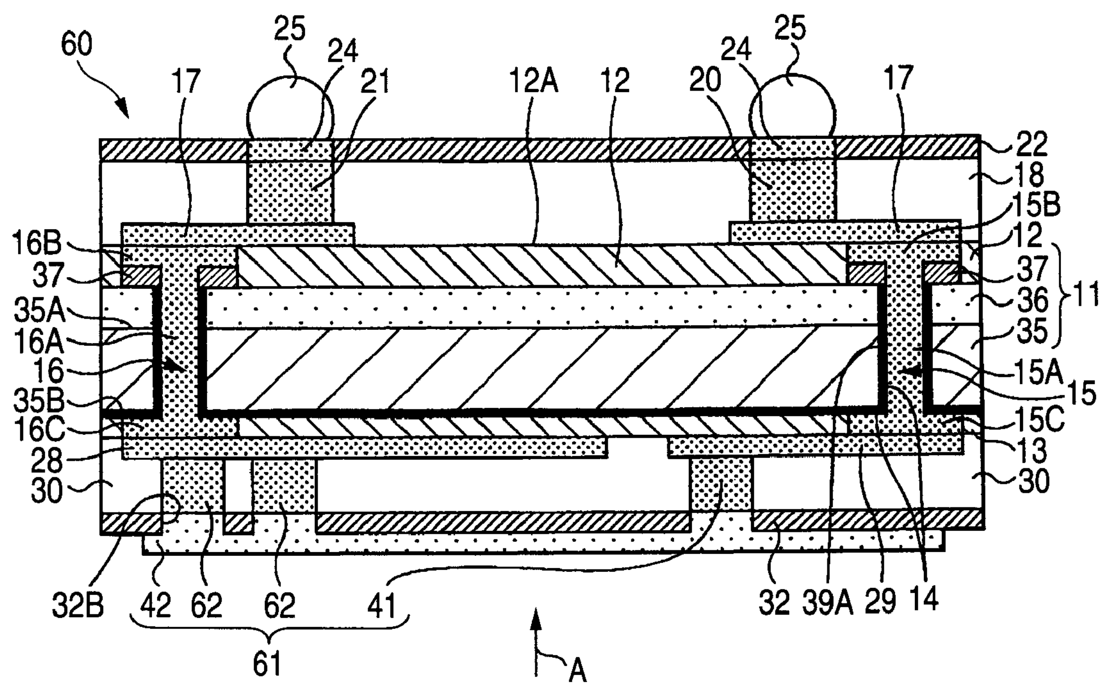
FIG. 18 is a sectional view of a semiconductor device according to a second embodiment of the invention.

FIG. 18 is a sectional view of a semiconductor device according to a second embodiment of the invention. In FIG. 18, the same numerals are assigned to the same components as those of the semiconductor device 10 of the first embodiment.

A semiconductor device 60 according to the second embodiment of the invention will be described with reference to FIG. 18. In addition, in the present embodiment, the case of using an inverted F-type antenna 61 as a passive circuit will be described below as an example.

The semiconductor device 60 is configured in a manner similar to the semiconductor device 10 of the first embodiment except that instead of the patch antenna 33 disposed in the semiconductor device 10 of the first embodiment, the inverted F-type antenna 61 is disposed and also via parts 62 of the inverted F-type antenna 61 are placed in an insulating layer 30 and an insulating film 32 and also openings 32B to which one ends of the via parts 62 are exposed are formed.

Figure 19:
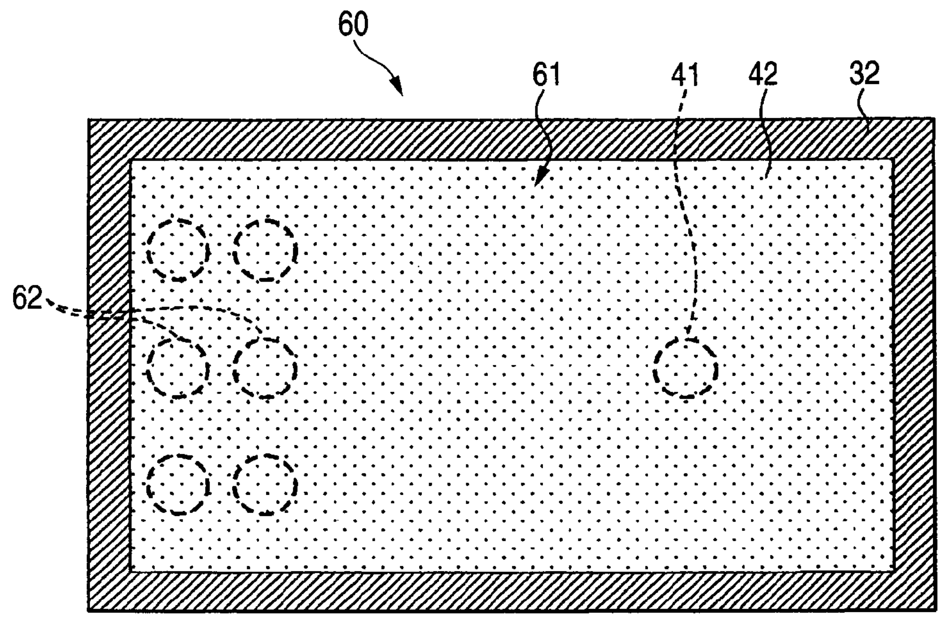
FIG. 19 is a diagram in which the semiconductor device shown in FIG. 18 is viewed from A.

FIG. 19 is a diagram in which the semiconductor device shown in FIG. 18 is viewed from A.

The inverted F-type antenna 61 will be described with reference to FIGS. 18 and 19.

The inverted F-type antenna 61 is disposed on the side of a second main surface 35B of a semiconductor substrate 35, and has a via part 41, an antenna part 42 and plural via parts 62. That is, the inverted F-type antenna 61 is configured to dispose the plural via parts 62 in addition to the components of the patch antenna 33.

The via parts 62 are disposed in the insulating layer 30 between a ground layer 28 and the antenna part 42. The via parts 62 are electrically connected to the ground layer 28 and the antenna part 42. As a result of this, the antenna part 42 is electrically connected to the ground layer 28 as well as a line for power feeding of a semiconductor element. As material of the via parts 62, for example, Cu can be used.

The semiconductor device 60 of the embodiment can obtain an effect similar to that of the semiconductor device 10 of the first embodiment.

In addition, a solder resist for protecting the inverted F-type antenna 61 may be disposed. Also, the embodiment can be applied to a semiconductor device without comprising an external connection terminal 25.

Further, the semiconductor device 60 of the embodiment can be manufactured by a technique similar to that of the semiconductor device 10 of the first embodiment, and can obtain an effect similar to that of the manufacturing method of the semiconductor device 10 of the first embodiment.

Third Embodiment

Figure 20:
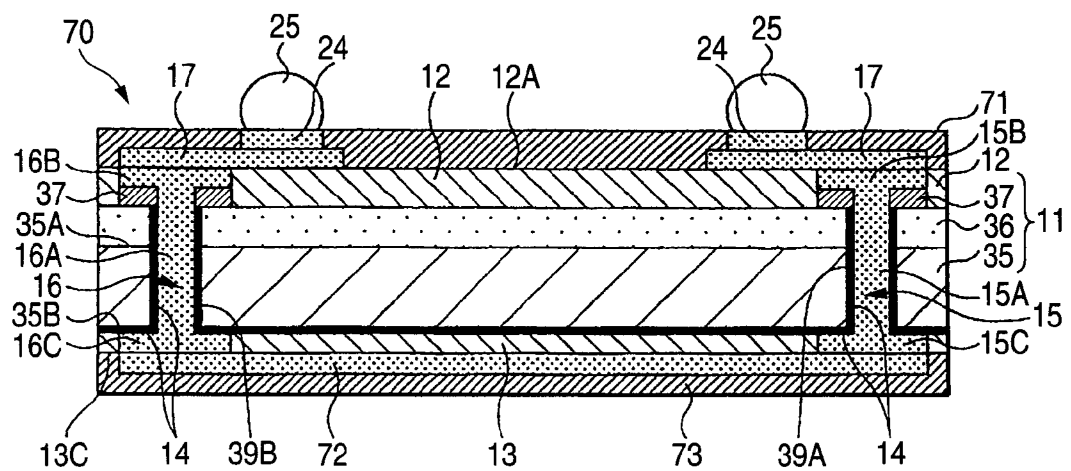
FIG. 20 is a sectional view of a semiconductor device according to a third embodiment of the invention.
Figure 21:
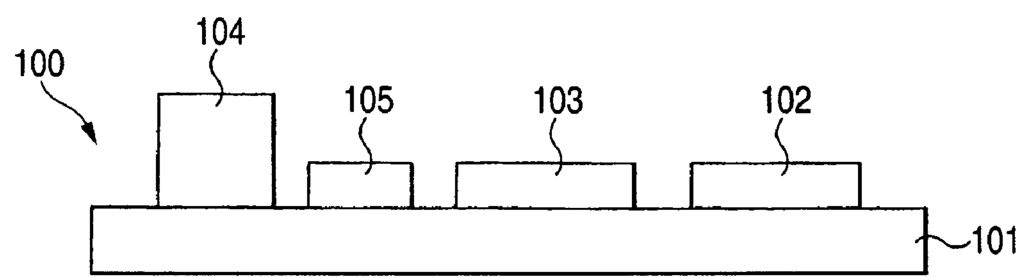
FIG. 21 is a sectional view of a related-art semiconductor device comprising a chip antenna.
Figure 22:
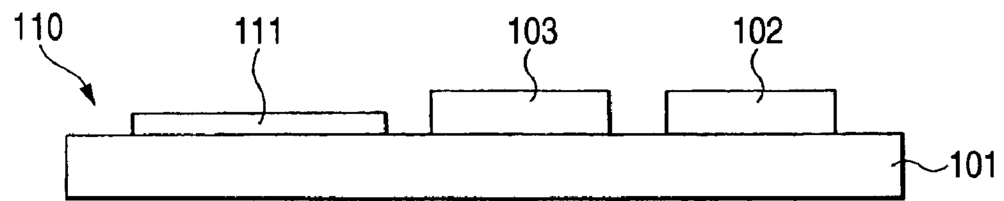
FIG. 22 is a sectional view of a related-art semiconductor device comprising an antenna pattern.

FIG. 20 is a sectional view of a semiconductor device according to a third embodiment of the invention. In FIG. 20, the same numerals are assigned to the same components as those of the semiconductor device 10 of the first embodiment.

A semiconductor device 70 according to the third embodiment of the invention will be described with reference to FIG. 20. The semiconductor device 70 is configured in a manner similar to the semiconductor device 10 of the first embodiment except that insulating films 71, 73 and a passive circuit 72 are disposed instead of the insulating layers 18, 30, the insulating films 22, 32, the ground layer 28, the wiring 29 and the patch antenna 33 disposed in the semiconductor device 10 of the first embodiment.

The insulating film 71 is disposed on a protective film 12 so as to cover wiring 17 (portion of the wiring 17 in which a diffusion preventive film 24 is not formed) with the wiring 17 corresponding to a formation position of the diffusion preventive film 24 exposed. As the insulating film 71, for example, a solder resist of an epoxy resin or a polyimide resin can be used. The diffusion preventive film 24 is disposed on the wiring 17 exposed to the insulating film 71. An external connection terminal 25 is disposed on the diffusion preventive film 24.

The passive circuit 72 is a passive circuit in which a ground layer is not required. The passive circuit 72 is disposed on a surface 13C of a protective film 13. The passive circuit 72 is electrically connected to connection parts 15C, 16C. The passive circuit 72 in which the ground layer is not required is applied to an oscillator such as a VCO (Voltage Controlled Oscillator). The VCO (mainly, a high-frequency oscillator in which a crystal oscillator cannot cope) requires a large inductance in order to adjust a Q value. As this solution, a large inductance can be obtained by forming a spiral coil pattern as the passive circuit 72.

The insulating film 73 is disposed on the surface 13C of the protective film 13 so as to cover the passive circuit 72. As the insulating film 73, for example, a solder resist of an epoxy resin or a polyimide resin can be used.

The semiconductor device 70 of the embodiment can obtain an effect similar to that of the semiconductor device 10 of the first embodiment.

In addition, the embodiment can be applied to a semiconductor device without comprising the external connection terminal 25. Also, when a semiconductor chip 11 is a semiconductor chip with high endurance, the insulating layers 18, 30 (insulating layers for sealing disposed in the semiconductor device 10, 60 of the first and second embodiments) may be omitted from the components as shown in the semiconductor device 70 of the embodiment.

Further, the semiconductor device 70 of the embodiment can be manufactured by a technique similar to that of the semiconductor device 10 of the first embodiment, and can obtain an effect similar to that of the manufacturing method of the semiconductor device 10 of the first embodiment.

The preferred embodiments of the invention have been described above in detail, but the invention is not limited to such specific embodiments, and various modifications and changes can be made within the gist of the invention described in the claims.

In addition, a capacitor or a resistor, etc. may be disposed as the passive circuit by a thin film step.

According to the invention, it can be applied to a semiconductor device capable of achieving miniaturization and also reducing cost, and a manufacturing method of the semiconductor device.

What is claimed is:

1. A semiconductor device comprising:

a semiconductor chip comprising a semiconductor substrate and an element formation layer which is formed on a first main surface of said semiconductor substrate and has a semiconductor element; and a passive circuit electrically connected to the semiconductor element, wherein the passive circuit is disposed on the side of a second main surface opposite to the first main surface of the semiconductor substrate and the passive circuit is electrically connected to the semiconductor element by a through electrode passing through the semiconductor chip, and wherein the passive circuit is a patch antenna or an inverted F-type antenna.

2. The semiconductor device as claimed in claim 1, further comprising:

a ground layer disposed on the second main surface of the semiconductor substrate; and a first insulating layer for covering said ground layer, wherein the through electrode has a first through electrode electrically connected to the ground layer and a second through electrode electrically connected to a power feeding line of the semiconductor element.

3. The semiconductor device as claimed in claim 1, wherein the passive circuit is electrically connected to the second through electrode when the passive circuit is a patch antenna.

4. The semiconductor device as claimed in claim 1, wherein the passive circuit is electrically connected to the first and second through electrodes when the passive circuit is an inverted F-type antenna.

5. The semiconductor device as in claim 1, further comprising:

a second insulating layer disposed on the element formation layer; and an external connection terminal disposed on said second insulating layer, wherein a wiring pattern for making electrical connection between the external connection terminal and the first and second through electrodes is disposed in the second insulating layer.

* * * * *

UNITED STATES PATENT AND TRADEMARK OFFICE

CERTIFICATE OF CORRECTION

PATENT NO. : 7,569,924 B2
APPLICATION NO. : 11/459543
DATED : August 4, 2009
INVENTOR(S) : Fujii It is certified that error appears in the above-identified patent and that said Letters Patent is hereby corrected as shown below:

On the Title Page, item [57], ABSTRACT, Line 2, after "layer" insert --36--.

Signed and Sealed this

Twenty-fourth Day of November, 2009

David J. Kappos

*Director of the United States Patent and Trademark Office*